(12) United States Patent
Kajiyama et al.

(10) Patent No.: US 8,395,060 B2
(45) Date of Patent: Mar. 12, 2013

(54) ELECTRONIC DEVICE

(75) Inventors: Kenichi Kajiyama, Hyogo (JP); Yuji Tominaga, Osaka (JP); Tomoki Sakamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 277 days.

(21) Appl. No.: 13/027,155

(22) Filed: Feb. 14, 2011

(65) Prior Publication Data

US 2011/0198119 A1 Aug. 18, 2011

(30) Foreign Application Priority Data

Feb. 17, 2010 (JP) ................................. 2010-032199

(51) Int. Cl.
*H05K 7/14* (2006.01)
(52) U.S. Cl. .......................... 174/542; 174/562; 396/536
(58) Field of Classification Search .................. 174/520, 174/542, 562; 396/266, 536
See application file for complete search history.

(56) References Cited

U.S. PATENT DOCUMENTS

| | | | |
|---|---|---|---|
| 6,317,569 B1 * | 11/2001 | Zander ........................... | 396/536 |
| 2001/0028795 A1 * | 10/2001 | Ichino ........................... | 396/266 |
| 2002/0141755 A1 * | 10/2002 | Manabe ........................ | 396/536 |
| 2010/0265388 A1 * | 10/2010 | Soumi ........................... | 348/374 |
| 2011/0131884 A1 * | 6/2011 | Herper et al. .................. | 49/386 |
| 2011/0199720 A1 * | 8/2011 | Kajiyama et al. ........ | 361/679.01 |

FOREIGN PATENT DOCUMENTS

JP 2006-50254 A 2/2006

* cited by examiner

*Primary Examiner* — Hung Ngo
(74) *Attorney, Agent, or Firm* — Shinjyu Global IP

(57) ABSTRACT

An electronic device includes a housing defining an interior space with an opening, a lid, a first locking member, a restricting member, and a second locking member. The lid is coupled to the housing to close and unclose the opening. The first locking member is coupled to the lid and movable in a first direction between a closed position to lock the lid over the opening and an open position to unlock the lid from over the opening. The restricting member is mounted to the lid and movable between a restricting position to prevent the first locking member from moving to the open position and a retracted position to permit the first locking member to move to the open position. The second locking member is coupled to the lid and movable in the first direction to allow the restricting member to switch between the restricting position and the retracted position.

14 Claims, 9 Drawing Sheets

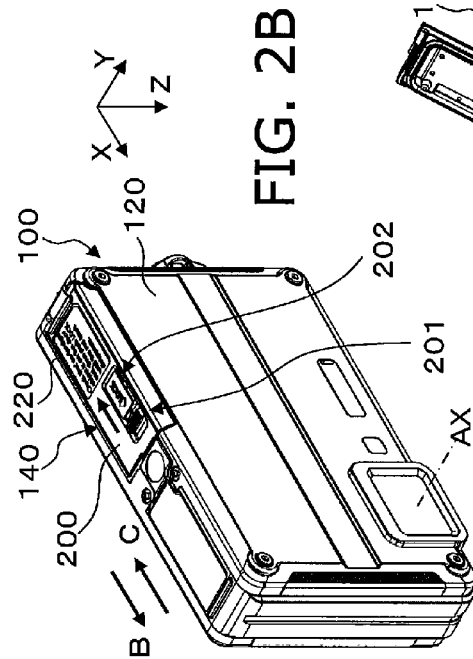
FIG. 2A
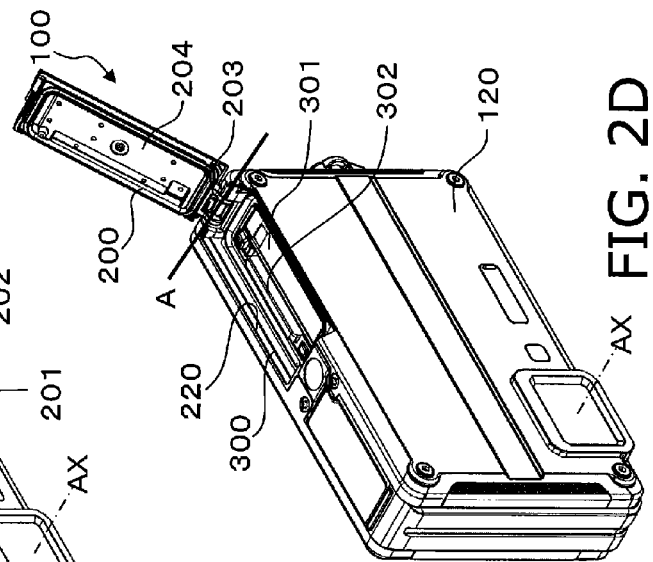
FIG. 2B
FIG. 2D
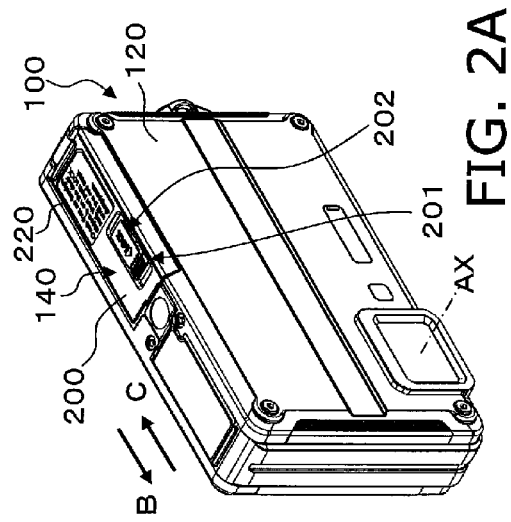
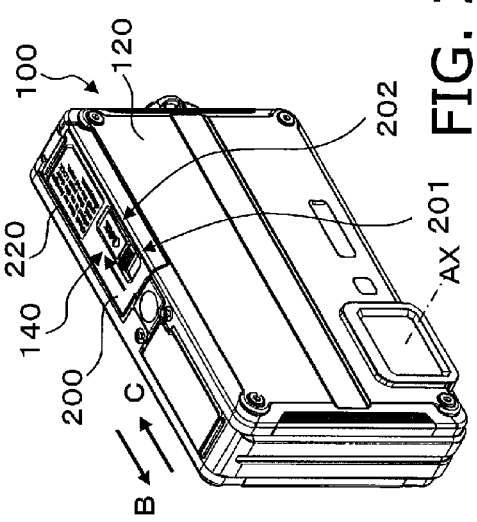
FIG. 2C

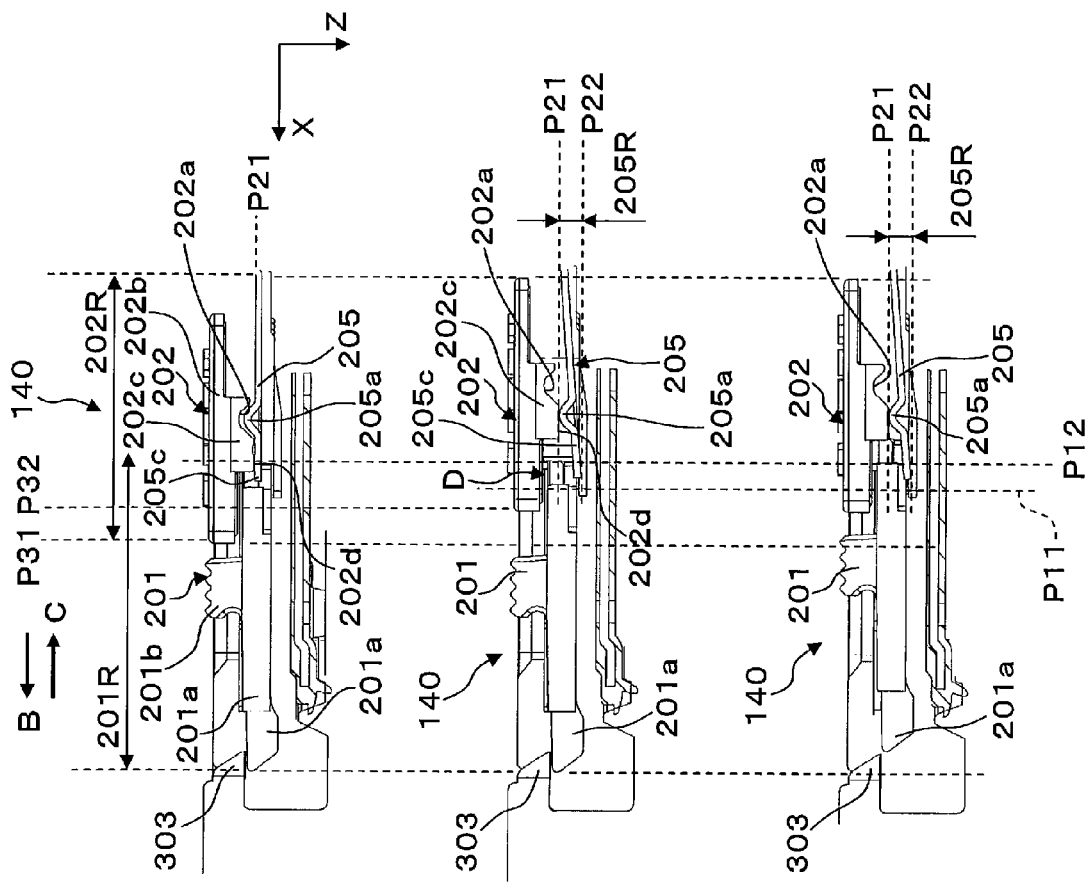

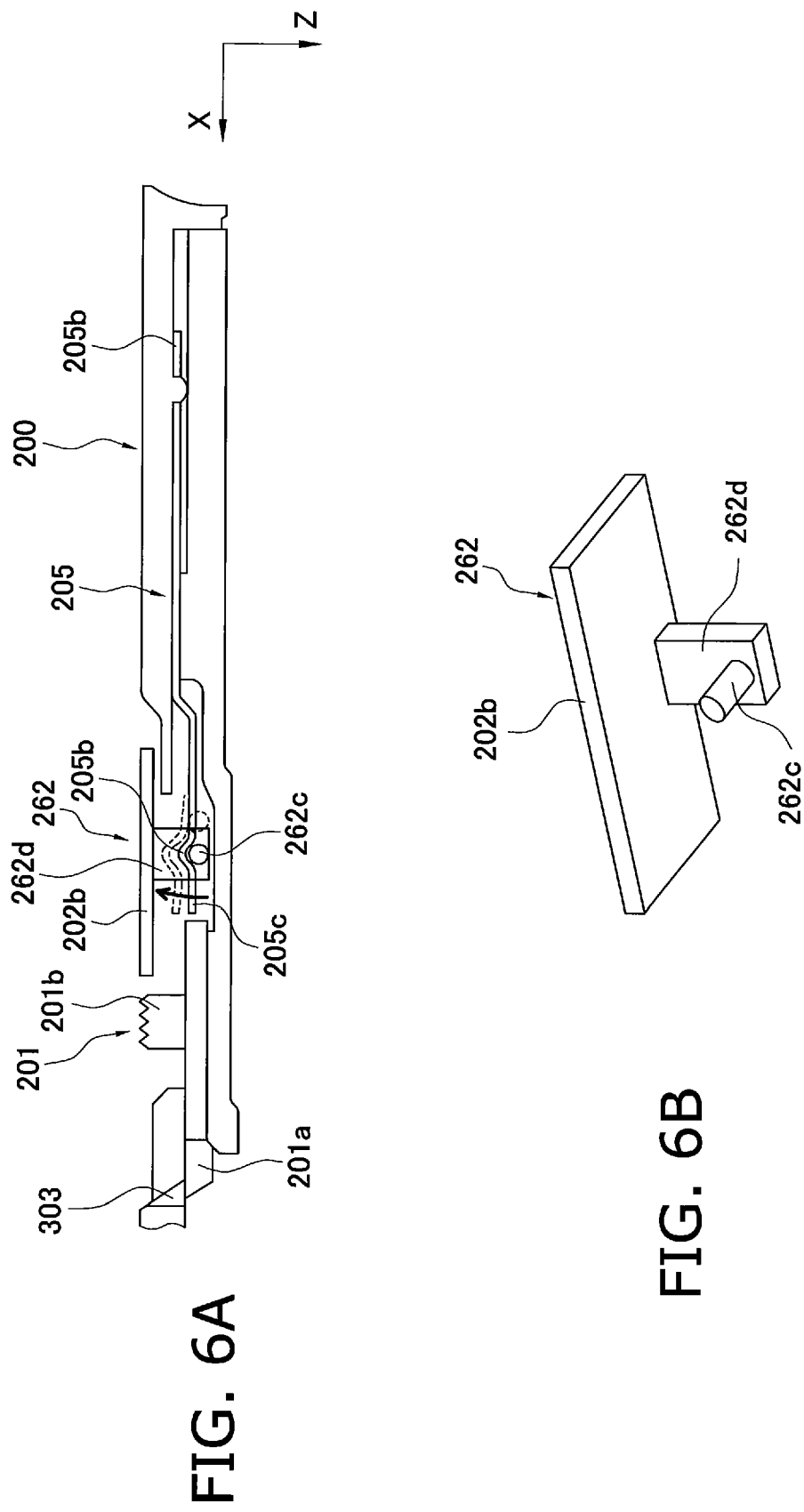

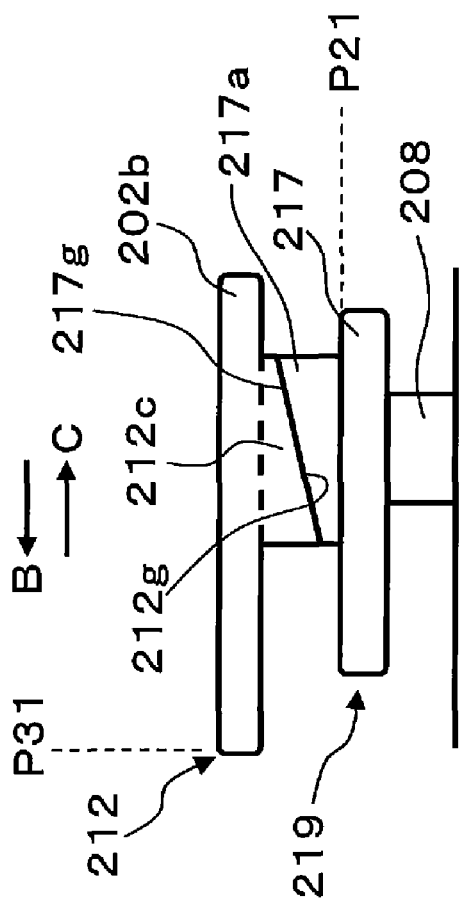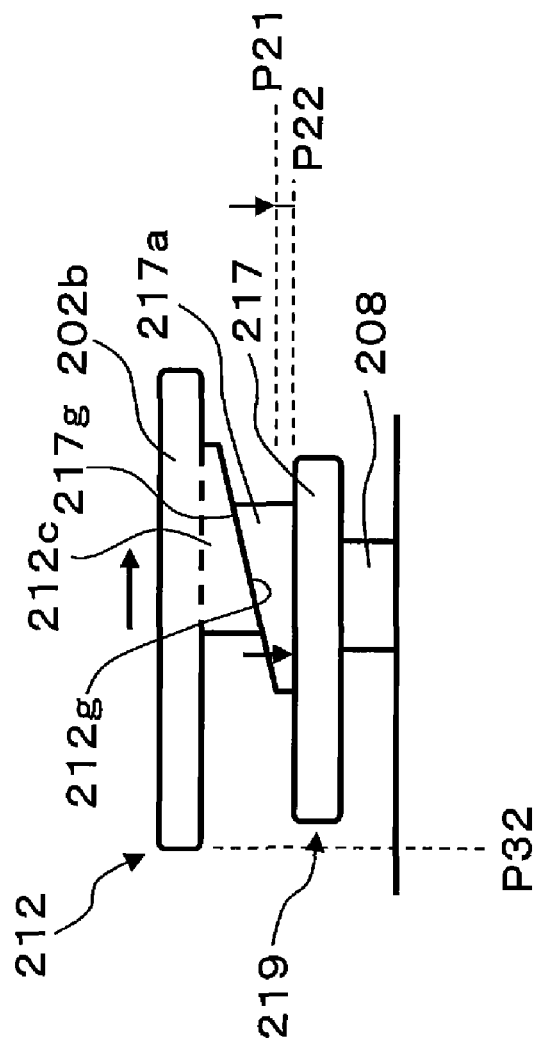
FIG. 9A
FIG. 9B

US 8,395,060 B2

ELECTRONIC DEVICE

CROSS-REFERENCE TO RELATED APPLICATIONS

This application claims priority under 35 U.S.C. §119 to Japanese Patent Application No. 2010-032199, filed on Feb. 17, 2010. The entire disclosures of Japanese Patent Applications No. 2010-032199 is hereby incorporated herein by reference.

BACKGROUND

1. Technical Field

The technology disclosed herein relates to an electronic device.

2. Background Information

Most electronic devices comprise a holding component that holds a battery or the like, and a lid that closes the holding component. The holding component usually accommodates a memory card or other such storage medium in addition to a battery.

With an electronic device such as this, however, if the lid is unintentionally opened during operation, the battery may fall out and the electronic device cease to operate. For example, if the electronic device is producing, editing, or recording data, it is possible that the data will be deleted or corrupted.

Also, if the electronic device is equipped with a waterproofing function, some way to prevent the lid from accidentally opening is essential. Furthermore, digital cameras on the market today can sometimes be used in the ocean to depths ranging from a few meters to about 10 meters, even though the case is not equipped with any waterproofing function such as a marine case. With a digital camera such as this, if the lid should open in the water, it could lead to malfunctioning of the digital camera itself.

In view of this, a lid locking mechanism has been proposed in order to prevent a lid from coming open accidentally (see Japanese Laid-Open Patent Application JP2006-50254, for example).

A lock lever that slides at a right angle to the sliding direction of the lid is installed in the electronic device described in JP2006-50254.

With the electronic device described in JP2006-50254, however, since the lock lever is disposed so as to slide at a right angle to the sliding direction of the lid, the portion that engages with the lock lever must be formed relatively long in the direction in which the lock lever moves. Therefore, the lid becomes larger in the sliding direction of the lock lever. A larger lid is undesirable because it leads to a bulkier electronic device.

SUMMARY

One object of the invention is to provide an electronic device in which accidental opening of a lid can be prevented while keeping the size of the electronic device to a minimum.

In accordance with one aspect of the invention, an electronic device is provided that includes a housing defining an interior space with an opening to access the interior space, a lid, a first locking member, a restricting member, and a second locking member. The lid is coupled to the housing to close and unclose the opening. The first locking member is coupled to the lid and movable in a first direction between a closed position to lock the lid over the opening and an open position to unlock the lid from over the opening. The restricting member is mounted to the lid and movable between a restricting position to prevent the first locking member from moving to the open position and a retracted position to permit the first locking member to move to the open position. The second locking member is coupled to the lid and movable in the first direction to allow the restricting member to switch between the restricting position and the retracted position.

Thus, with this electronic device, the lid is prevented from being accidentally unlocked, while a more compact size can be attained.

These and other objects, features, aspects and advantages of the present invention will become apparent to those skilled in the art from the following detailed description, which, taken in conjunction with the annexed drawings, discloses embodiments of the present invention.

BRIEF DESCRIPTION OF DRAWINGS

Referring now to the attached drawings which form a part of this original disclosure:

FIGS. 2A to 2D are diagrams illustrating the operation of opening the lid;

FIG. 4 is a cross section of the main parts of a lid locking mechanism;

FIG. 6A is a cross section of a lid locking mechanism (second embodiment), and FIG. 6B is an oblique view of a second lock lever;

FIGS. 9A and 9B are simplified diagrams of a second lock lever and a restricting member (another embodiment).

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

First Embodiment

1: Configuration of Digital Camera

A digital camera 100 pertaining to a first embodiment will be described through reference to FIGS. 1A to 4C. To facilitate the description, a three-dimensionally perpendicular coordinate system is set up for the digital camera 100. The X axis is set parallel to the left and right direction when the digital camera 100 is used. The Y axis is set parallel to the optical axis AX of the digital camera 100. The Z axis is set parallel to the up and down direction (vertical direction) when the digital camera 100 is used. In the following description, the X axis direction shall be a direction parallel to the X axis, and is an example of a first direction. The Y axis direction shall be a direction parallel to the Y axis. The Z axis direction shall be a direction parallel to the Z axis. The left side facing the subject shall be termed the X axis direction positive side. The subject side in the Y axis direction shall be termed the Y axis direction positive side. The upper side along the Z axis direction shall be termed the Z axis direction positive side.

The vertically upper side (Z axis direction positive side) in the normal orientation of the digital camera 100 (hereinafter also referred to as the landscape orientation) is also called the top, and the vertically lower side (Z axis direction negative side) the bottom, but these expressions do not serve to limit the usage state of the digital camera 100.

Figure 1B:
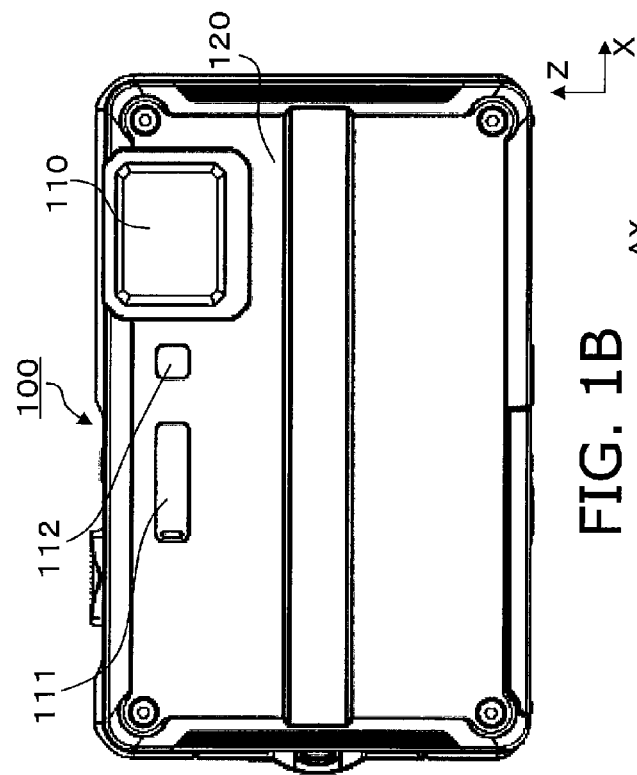
FIG. 1B is a front view of a digital camera.
Figure 1C:
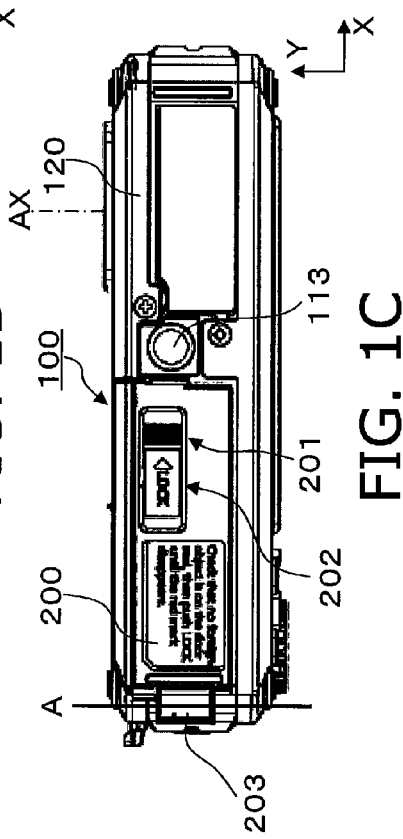
FIG. 1C is a bottom view of a digital camera.
Figure 1A:
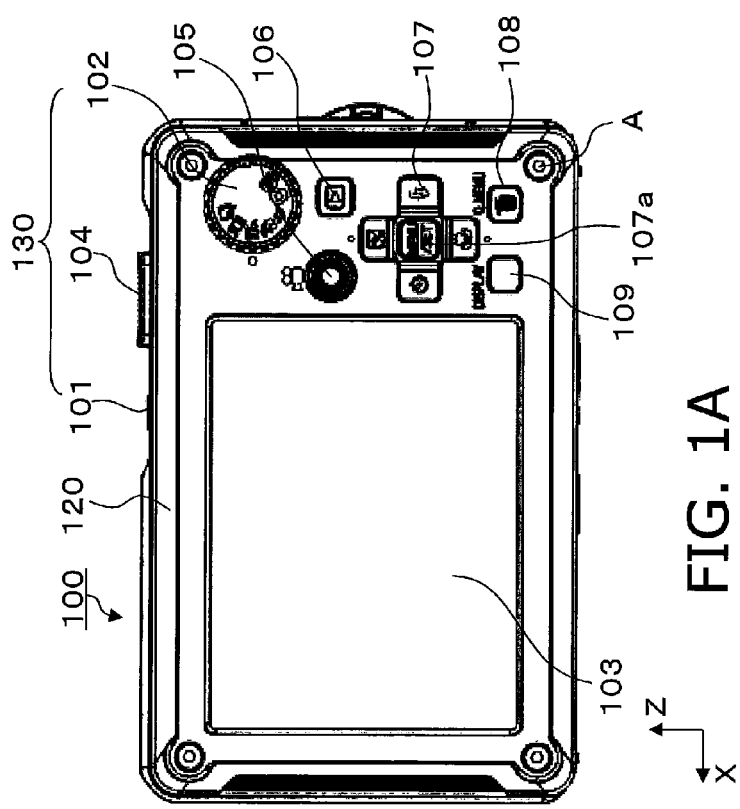
FIG. 1A is a rear view of a digital camera.

As shown in FIGS. 1A to 1C, the digital camera 100 (an example of an electronic device) comprises an optical system 110, a strobe 111, a manipulation unit 130, a body 120 (an example of a housing), a lid 200 (an example of a lid), and a lid locking mechanism 140.

As shown in FIG. 1B, the optical system 110 is disposed on the front face of the digital camera 100, and leads light to an imaging element (not shown). The optical system 110 has an optical axis AX. The strobe 111 is provided to the front face of the digital camera 100 to make imaging possible in dark locations. For example, the digital camera 100 employs an auto-focus function that automatically adjusts the focus on a particular subject. An AF auxiliary light generator 112 is provided so that the auto-focus function can operate properly even in dark locations.

As shown in FIG. 1A, the manipulation unit 130 has a power button 101, a mode dial 102, a liquid crystal monitor 103, a shutter button 104, a moving picture button 105, a reproduction button 106, a cross key 107, a quick menu button 108, and a display button 109. The manipulation unit 130 is provided on the front and rear faces of the body 120.

When the power button 101 is pressed, power is supplied to the digital camera 100. The desired imaging mode can be selected by turning the mode dial 102. Since the subject is displayed on the liquid crystal monitor 103, the user can compose a picture while looking at the subject displayed on the liquid crystal monitor 103. When the shutter button 104 is pressed, a still picture can be captured. When the moving picture button 105 is pressed, a moving picture can be captured. When the reproduction button 106 is pressed, a captured still or moving picture can be reproduced on the liquid crystal monitor 103.

When the cross key 107 is pressed, various settings can be made for imaging or reproduction. In addition to showing directions, the various buttons that make up the cross key 107 may also be assigned individual functions. For instance, in addition to showing the upward direction, the up button cross key 107 may also be assigned the function of exposure correction. Also, a menu button 107a is provided in the center of the cross key 107. When this menu button 107a is pressed, a setting menu screen is displayed on the liquid crystal monitor 103.

When the quick menu button 108 is pressed, some of the settings can be easily changed. The quick menu button 108 also functions as a delete button for deleting captured still or moving pictures.

When the display button 109 is pressed, the information displayed on the liquid crystal monitor 103 is switched. Imaging information, guidelines that assist in composing a picture, and so forth are displayed on the liquid crystal monitor 103.

The body 120 includes the shell or frame of the digital camera 100, and has a holding unit 300. A battery 301 and a memory card 302 are removably held in the holding unit 300. The holding unit 300 has an opening 220 (an example of an opening). The opening 220 has a substantially rectangular shape that extends in the X axis direction. The opening 220 is formed in the bottom face of the body 120. An attachment screw hole 113 for fixing a tripod or monopod to the digital camera 100 is provided to the bottom face of the body 120. The lid 200 is mounted to the bottom face of the body 120.

The lid 200 (an example of a lid) is coupled to a camera body 230 so that the opening 220 can be opened and closed. More specifically, a hinge 203 is provided to the edge of the opening 220, and the lid 200 is rotatably coupled by the hinge 203 to the camera body 230. Since the opening 220 is longer in the X axis direction, the lid 200 also has a substantially rectangular shape that is longer in the X axis direction. In this embodiment, the lid 200 rotates around a rotational axis A, but does not slide in the X axis direction with respect to the body 120. The hinge 203 is disposed at a closer corner of the digital camera 100 to the bottom face.

As shown in FIG. 2D, a gasket 204 is mounted to the rear face of the lid 200 to prevent liquids or dust from penetrating through the gap formed between the lid 200 and the opening 220. When the lid 200 is opened, the battery 301 and the memory card 302 held in the holding unit 300 can be seen. The battery 301 and the memory card 302 can be installed or removed as needed.

Meanwhile, the lid locking mechanism 140 is built into the lid 200 to lock the lid 200 in a closed state with respect to the body 120. The configuration of the lid locking mechanism 140 will now be described.

2: Configuration of Lid Locking Mechanism 140

Figure 3:
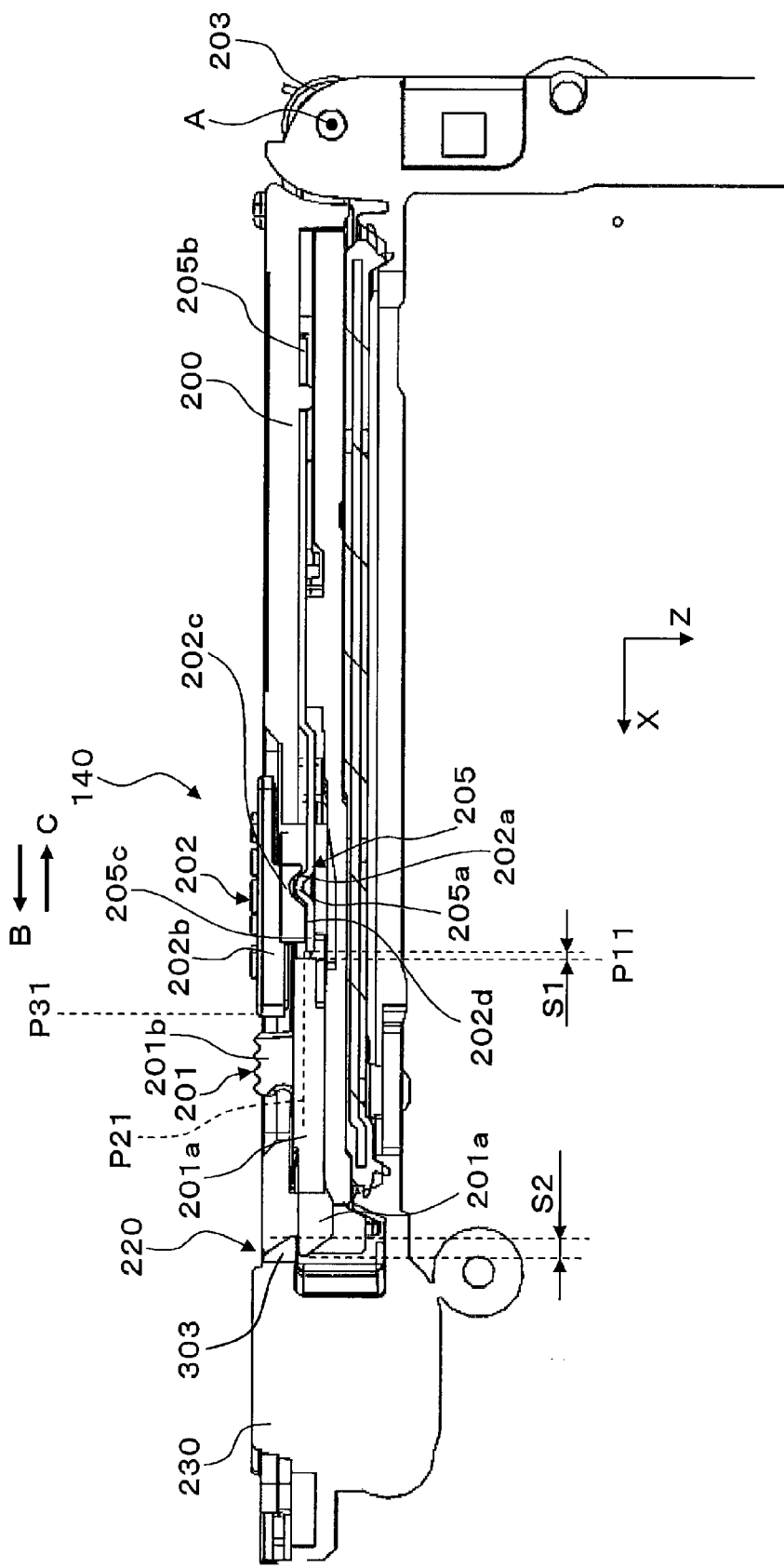
FIG. 3 is a cross section of a lid locking mechanism.

More specifically, as shown in FIG. 3, the lid locking mechanism 140 has a first lock lever 201 (an example of a first locking member), a leaf spring 205 (an example of a restricting member), and a second lock lever 202 (an example of a second locking member).

2.1: First Lock Lever 201

The first lock lever 201 is provided to lock the lid 200 in a closed state, and is supported by the lid 200 movably in the X axis direction. As shown in FIGS. 3 and 4A to 4C, the first lock lever 201 is disposed movably between a closed position P11 (an example of a closed position), in which the lid 200 is locked in a closed state with respect to the opening 220, and an open position P12 (an example of an open position), in which the lid 200 is unlocked with respect to the opening 220. The closed position P11 and open position P12 use as a reference the end face of the first lock lever 201 that is near the leaf spring 205.

As shown in FIG. 3, the first lock lever 201 has a lock lever main body 201c, a lock pawl 201a, and a knob 201b. The lock lever main body 201c has a substantially plate-like shape that extends in the X axis direction, and is disposed so as to be able to come into contact with the leaf spring 205.

The lock pawl 201a protrudes in a B direction from the lock lever main body 201c. The opening 220 has a protrusion 303 provided so as to be able to come into contact with the lock pawl 201a. If the first lock lever 201 is disposed at the closed position P11 with the lid 200 in its closed state, the lock pawl 201a catches the hinge 203. At this point the gasket 204 is compressed between the lid 200 and the edge of the opening 220, so the lock pawl 201a is pressed against the protrusion 303 by the elastic force of the gasket 204. Consequently, the lid 200 can be locked in its closed state. Meanwhile, when the first lock lever 201 is disposed at the open position P12, the lock pawl 201a does not catch the protrusion 303, so the lid 200 can be opened.

The knob 201b is provided to make operation easier for the user, and protrudes from the lock lever main body 201c. The knob 201b is disposed at substantially the center position of the lock lever main body 201c. The first lock lever 201 can be slid by operating the knob 201b.

2.2: Leaf Spring 205

The leaf spring 205 is provided to restrict the first lock lever 201 from moving to the open position P12, and is mounted to the lid 200 so as to be capable of elastic deformation in the Z axis direction. The leaf spring 205 extends in a slender shape in the X axis direction, and is disposed along the rear face 200a of the lid 200. The direction in which the leaf spring 205 extends coincides with the lengthwise direction of the digital camera 100. The leaf spring 205 is made of metal, for example.

The leaf spring 205 is disposed movably between a restricting position P21 (an example of a restricting position), at which movement of the first lock lever 201 to the open position P12 is restricted, and a retracted position P22 (an example of a retracted position), at which movement of the first lock lever 201 to the open position P12 is permitted. Switching the leaf spring 205 between the restricting position P21 and the retracted position P22 is performed by the second lock lever 202.

The leaf spring 205 has a first end 205b (an example of a first end) fixed to the lid 200, and a second end 205c (an example of a second end) capable of coming into contact with the first lock lever 201. The first end 205b is disposed at a position farther away from the first lock lever 201 than the second end 205c. The second end 205c is disposed movably to the restricting position P21 and the retracted position P22, with the first end 205b serving as a fulcrum. In this embodiment, the restricting position P21 and the retracted position P22 are disposed aligned in the Z axis direction, and the restricting position P21 is closer to the second lock lever 202 than the retracted position P22.

The leaf spring 205 is disposed at the restricting position P21 in its free state. Therefore, when the leaf spring 205 is guided by the second lock lever 202 to the retracted position P22, the leaf spring 205 bends overall and tries to return to the restricting position P21.

Also, the leaf spring 205 has a convex part 205a (an example of a restrictor, and an example of a convex part) disposed around the second end 205c. The convex part 205a protrudes to the second lock lever 202 side, and is formed so as to bend the leaf spring 205. As the leaf spring 205 is guided by the second lock lever 202, the convex part 205a slides with a guide portion 202c of the second lock lever 202. The convex part 205a restricts the movement of the second lock lever 202 in the X axis direction.

2.3: Second Lock Lever 202

The second lock lever 202 is provided in order to lock the first lock lever 201 at the closed position P11, and is supported by the lid 200 movably in the X axis direction. The second lock lever 202 is disposed so as to be able to switch the position of the leaf spring 205 between the restricting position P21 and the retracted position P22. More specifically, the second lock lever 202 is disposed movably between a locked position P31 (an example of a first position), at which the leaf spring 205 is guided to the restricting position P21, and an unlocked position P32 (an example of a second position), at which the leaf spring 205 is guided to the retracted position P22. In this embodiment, the locked position P31 is disposed closer to the first lock lever 201 than the unlocked position P32.

The second lock lever 202 has a lever main body 202b and the guide portion 202c (an example of a guide portion). The lever main body 202b is provided in order to make operation easier for the user, and has a substantially plate-like shape.

The guide portion 202c protrudes from the lever main body 202b toward the leaf spring 205, and is provided slidably with the leaf spring 205. The guide portion 202c guides the leaf spring 205 between the restricting position P21 and the retracted position P22. More specifically, the guide portion 202c has a concave part 202a and a support face 202d. The concave part 202a (an example of a concave part) is recessed more to the lever main body 202b side than the support face 202d.

When the second lock lever 202 is disposed at the locked position P31, the convex part 205a of the leaf spring 205 is fitted into the concave part 202a, and the leaf spring 205 is held at the restricting position P21. Since the convex part 205a is fitted into the concave part 202a, movement of the second lock lever 202 in the X axis direction is restricted by the convex part 205a.

When the second lock lever 202 moves from the locked position P31 to the unlocked position P32, the leaf spring 205 is guided from the restricting position P21 to the retracted position P22. When the second lock lever 202 is disposed at the unlocked position P32, the support face 202d comes into contact with the convex part 205a, and the guide portion 202c holds the leaf spring 205 at the retracted position P22. In this way the second end 205c is guided by the second lock lever 202 to the restricting position P21 and the retracted position P22.

When the second end 205c is disposed at the retracted position P22, a space D is formed between the leaf spring 205 and the second lock lever 202. The end of the first lock lever 201 can be inserted into this space D. Therefore, in a state in which the leaf spring 205 is disposed at the retracted position P22, the first lock lever 201 can move to the open position P12, and the lid 200 can be opened.

On the other hand, when the second lock lever 202 moves from the unlocked position P32 to the locked position P31, the leaf spring 205 is guided from the retracted position P22 to the restricting position P21. When the second lock lever 202 is disposed at the locked position P31, the leaf spring 205 is held at the restricting position P21. As shown in FIG. 3, in this state the size Si of the gap formed between the leaf spring 205 and the first lock lever 201 is smaller than the size S2 of the portion of the lock pawl 201a that overlaps the protrusion 303. Accordingly, the first lock lever 201 cannot be moved to the open position P12, and the lid 200 is securely locked in a closed state.

The convex part 205a and the guide portion 202c have mutually complementary shapes. More specifically, the guide portion 202c has the concave part 202a that is recessed so as to accept the convex part 205a. The convex part 205a of the leaf spring 205 can be fitted into the concave part 202a. When the second lock lever 202 is disposed at the locked position P31, the convex part 205a is fitted into the concave part 202a in a state in which the leaf spring 205 is disposed at the restricting position P21. Consequently, the second lock lever 202 can be held at the locked position P31.

As shown in FIGS. 4A to 4C, part of the first lock lever 201 (more precisely, the closer end of the lock lever main body 201c to the leaf spring 205) is disposed in a movement region 201R of the leaf spring 205. In other words, part of the leaf spring 205 (more precisely, the second end 205c of the leaf spring 205) is disposed in a movement range 205R of the first lock lever 201.

The direction in which the first lock lever 201 moves from the open position P12 to the closed position P11 is the B direction. Also, the direction in which the second lock lever 202 moves from the unlocked position P32 to the locked position P31 is the B direction. Therefore, the direction in which the first lock lever 201 moves from the open position P12 to the closed position P11 is the same as the direction in which the second lock lever 202 moves from the unlocked position P32 to the locked position P31.

The second lock lever 202 is disposed at a position where there is no interference with the first lock lever 201, but when viewed in the Z axis direction, the movement region 201R of the first lock lever 201 overlaps a movement region 202R of the second lock lever 202.

3: Operation 3.1: Basic Procedure

In the state shown in FIG. 2A, the first lock lever 201 is disposed at the closed position P11, and the second lock lever 202 is disposed at the locked position P31. The basic procedure in opening the lid 200 from this state is as follows.

(A1) The second lock lever 202 is slid in the C direction from the locked position P31 to the unlocked position P32 (FIG. 2B).

(A2) The first lock lever 201 is slid in the C direction from the closed position P11 to the open position P12 (FIG. 2C).

(A3) The lid 200 is opened (FIG. 2D).

Also, the basic procedure when closing and locking the lid 200 from the state shown in FIG. 2D is the reverse operation of A1 to A3 above, as discussed below.

(B1) The lid 200 is closed (FIG. 2C).

(B2) The first lock lever 201 is slid in the B direction from the open position P12 to the closed position P11.

(B3) The second lock lever 202 is slid in the B direction from the unlocked position P32 to the locked position P31.

3.2: Detailed Operation

The operation of the lid locking mechanism 140 will be described. Here, the operation of the lid locking mechanism 140 when opening the lid 200 will be described.

In the state shown in FIG. 2A and FIG. 4A, the first lock lever 201 is disposed at the closed position P11, and the second lock lever 202 is disposed at the locked position P31. In this state, the lock pawl 201a of the first lock lever 201 is caught by the protrusion 303 of the opening 220. Furthermore, since the second end 205c of the leaf spring 205 is held at the restricting position P21 by the second lock lever 202, even if an attempt is made to move the first lock lever 201 in the C direction, the first lock lever 201 will come into contact with the leaf spring 205.

Here, as mentioned above, the size Si of the gap formed between the leaf spring 205 and the first lock lever 201 is smaller than the size S2 of the portion of the lock pawl 201a that overlaps the protrusion 303, so even if the first lock lever 201 is moved until it hits the leaf spring 205, the state of the lock pawl 201a being caught by the protrusion 303 can be maintained. Therefore, the lid 200 can be prevented from opening accidentally.

In the state shown in FIG. 4A, since the convex part 205a of the leaf spring 205 is fitted into the concave part 202a of the guide portion 202c, movement of the second lock lever 202 in the X axis direction is restricted by the leaf spring 205. Consequently, the second lock lever 202 can be prevented from sliding accidentally to the unlocked position P32.

When just the second lock lever 202 is slid in the C direction from the state shown in FIG. 4A, the second lock lever 202 moves from the locked position P31 to the unlocked position P32. As a result, the leaf spring 205 is guided by the second lock lever 202 from the restricting position P21 to the retracted position P22. More specifically, when the second lock lever 202 is slid from the locked position P31 to the unlocked position P32, the convex part 205a is guided by the inner face of the concave part 202a to the Z axis direction positive side (the lower side in FIG. 4A), and the convex part 205a reaches the support face 202d of the guide portion 202c. At this point the convex part 205a is pushed to the Z axis direction positive side by the guide portion 202c, and the second end 205c moves from the restricting position P21 to the retracted position P22. As a result, the space D is formed between the leaf spring 205 and the second lock lever 202 (FIG. 4B).

Since the end of the first lock lever 201 can be inserted into the space D, the first lock lever 201 can be slid from the closed position P11 to the open position P12. When the first lock lever 201 is moved in the C direction in the state shown in FIG. 4B, the lock pawl 201a of the first lock lever 201 is no longer caught by the protrusion 303 (FIG. 4C). As a result, the lid 200 can be opened as shown in FIG. 2D.

In the transition from the state shown in FIG. 2C to the state shown in FIG. 2D, the lid 200 may be held open by hand, or a coil spring (not shown) may be mounted to the hinge 203, for example, so that the lid 200 will open automatically when the first lock lever 201 is moved to the open position P12.

4: Features 4.1: As described above, when the first lock lever 201 is disposed at the closed position P11, the lid 200 is locked in its closed state with respect to the opening 220. If at this point the second lock lever 202 is used to switch the leaf spring 205 to the restricting position P21, movement of the first lock lever 201 to the open position P12 will be restricted by the leaf spring 205. Therefore, the lid 200 can be prevented from being accidentally unlocked.

Also, since the first lock lever 201 and the second lock lever 202 are disposed movably in the X axis direction (an example of the first direction), the size can be reduced in the Y axis direction or Z axis direction (an example of a direction perpendicular to the first direction).

Thus, with this digital camera 100, the lid 200 can be prevented from being accidentally unlocked, while a smaller size can also be achieved.

4.2: Since the leaf spring 205 extends in a slender shape in the X axis direction, the stiffness of the leaf spring 205 in the X axis direction is high. Accordingly, when movement of the first lock lever 201 is restricted by the leaf spring 205, a relatively strong force can be received by the leaf spring 205.

4.3: When the leaf spring 205 is disposed at the restricting position P21, movement of the second lock lever 202 in the X axis direction is restricted by the convex part 205a, so it is easier to maintain a state in which the leaf spring 205 is held at the restricting position P21. Therefore, accidental unlocking of the lid 200 can be reliably prevented.

4.4: Providing the convex part 205a and the concave part 202a provides the user with a nice clicking feel when sliding the second lock lever 202. Consequently, this reassures the user that the lid 200 has been completed locked.

Second Embodiment

In the first embodiment above, the second end 205c of the leaf spring 205 moves in the Z axis direction, but a constitution is also possible in which the second end 205c moves in the Y axis direction. Components having substantially the same function as those in the first embodiment will be numbered the same here, and will not be described again in detail.

Figure 5A:
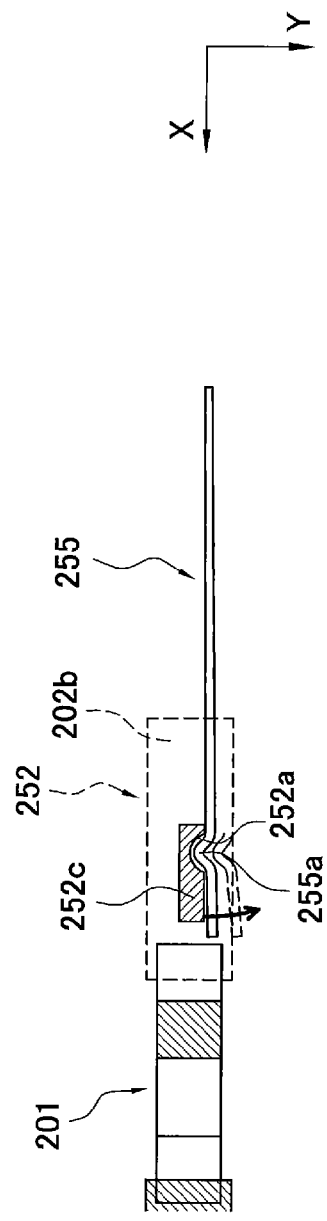
FIG. 5A is a plan view of a lid locking mechanism (second embodiment)
Figure 5B:
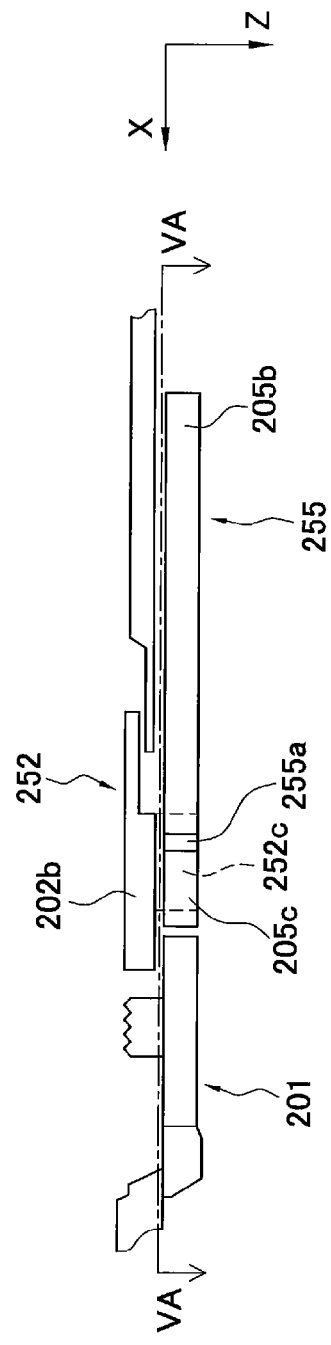
FIG. 5B is a cross section of a lid locking mechanism (second embodiment)

As shown in FIGS. 5A and 5B, with the digital camera 100 pertaining to the second embodiment, the restricting position P21 and the retracted position P22 are aligned in the Y axis direction. A leaf spring 255 (an example of a restrictor) is guided by a second lock lever 252 (an example of a second locking member) to the restricting position P21 and the retracted position P22. Just as in the first embodiment, the leaf spring 255 is disposed at the restricting position P21 in its free state.

The first lock lever 201 and the second lock lever 252 are supported by the lid 200 movably in the X axis direction. The second lock lever 252 has a lever main body 202b and a guide portion 252c. The guide portion 252c has basically the same constitution as the guide portion 202c, but differs in its positional relation to the leaf spring 255. More specifically, as shown in FIG. 5A, the guide portion 252c is disposed on the Y axis direction negative side of the leaf spring 255. The guide portion 252c has a concave part 252a and a support face 252d. When the second lock lever 252 is disposed at the locked position P31, a convex part 255a of the leaf spring 255 is fitted into the concave part 252a.

The leaf spring 255 has basically the same constitution as the leaf spring 205, but the second end 205c is disposed so as to move in the Y axis direction. The second end 205c is guided by the second lock lever 252 to the restricting position P21 and the retracted position P22.

The same effect can be obtained with this constitution as with the digital camera 100 pertaining to the first embodiment.

Third Embodiment

In the first embodiment above, the restricting position P21 was closer to the second lock lever 202 than the retracted position P22, but a constitution is also possible in which the retracted position P22 is closer to the second lock lever 202 than the restricting position P21.

As shown in FIGS. 6A and 6B, with the digital camera 100 pertaining to the third embodiment, the leaf spring 205 is guided by a second lock lever 262 (an example of a second locking member) to the restricting position P21 and the retracted position P22. More specifically, the second lock lever 262 has a lever main body 202b and a guide portion 262c. The guide portion 262c has a plate portion 262e that protrudes in the Z axis direction from the lever main body 202b, and a guide pin 262f that protrudes in the Y axis direction from the plate portion 262e. When the leaf spring 205 is disposed at the restricting position P21, the guide pin 262f is fitted into the recess on the rear side of the convex part 205a of the leaf spring 205. When the second lock lever 262 is slid from the locked position P31 to the unlocked position P32, the leaf spring 205 is pushed by the guide pin 262f to the Z axis direction negative side and guided to the retracted position P22. In this state, the space D is formed on the X axis direction negative side of the first lock lever 201, so the first lock lever 201 can be moved to the open position P12.

When the second lock lever 262 is slid from the unlocked position P32 to the locked position P31, the leaf spring 205 is guided by the second lock lever 262 to the restricting position P21. More specifically, when the second lock lever 262 is slid from the unlocked position P32 to the locked position P31, the guide pin 262f is fitted into the recess on the rear side of the convex part 205a, so the leaf spring 205 is returned to the restricting position P21 by elastic force. Also, since the guide pin 262f is fitted into the recess on the rear side of the convex part 205a, the second lock lever 262 is held at the locked position P31 by the leaf spring 205. The guide portion 262c and the convex part 205a have mutually complementary shapes.

Again with this constitution, the same effect can be obtained as with the digital camera 100 pertaining to the first embodiment.

5: Other Embodiments

The present invention is not limited to or by the above embodiments, and various changes and modifications are possible without departing from the scope of the invention.

In the following description, components having substantially the same function as those in the above embodiments will be numbered the same, and will not be described again in detail.

5.1: Positional Relation Between First Lock Lever 201 and Second Lock Lever 402

In the above embodiments, the movement direction of the first lock lever 201 matched the movement direction of the second lock lever 202, but the constitution may instead be one in which the second lock lever 202 moves along the movement direction of the first lock lever 201. That is, the movement direction of the first lock lever 201 need only substantially coincide with the movement direction of the second lock lever 202.

Also, the first lock lever 201 and the second lock lever 202 were disposed aligned in their movement direction, but the second lock lever 202 may be offset to a direction perpendicular to the movement direction with respect to the first lock lever 201.

Figure 7:
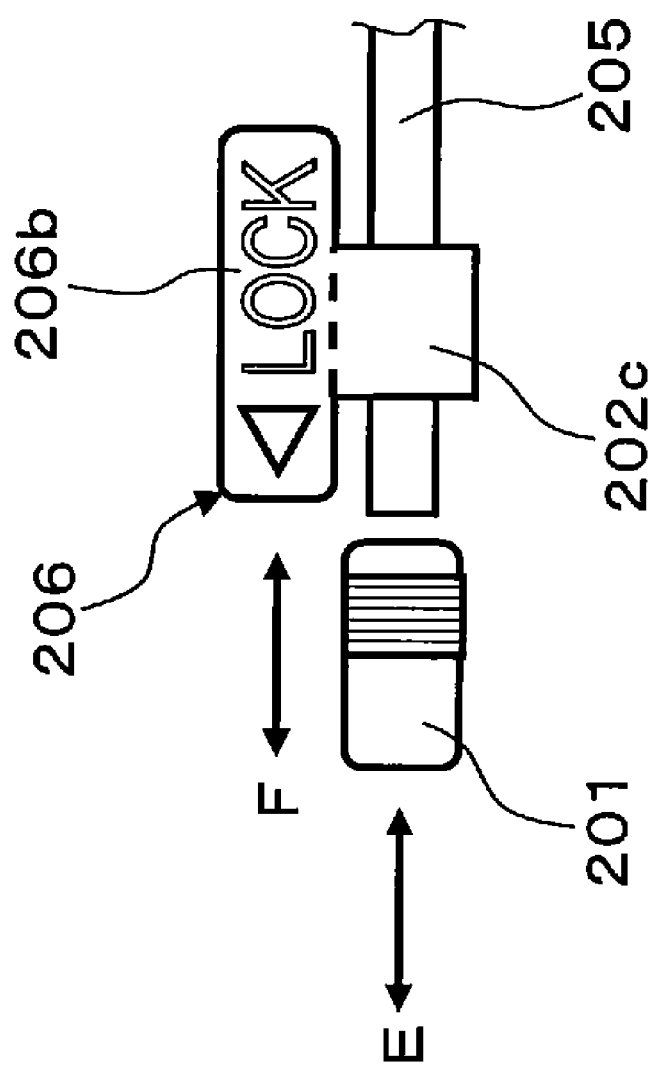
FIG. 7 is a simplified diagram of the disposition of a slide knob and a lock lever (another embodiment)

FIG. 7 is a simplified diagram of the layout of the first lock lever 201 and a second lock lever 206. FIG. 7 is a plan view of the first lock lever 201, the second lock lever 206, and the leaf spring 205 as seen from the Z axis direction negative side. The second lock lever 206 has a lever main body 206b and a guide portion 202c. As shown in FIG. 7, the lever main body 206b is disposed to the side of the guide portion 202c, and does not overlap the leaf spring 205 when viewed in the Z axis direction. In this case, the movement region of the first lock lever 201 and the second lock lever 206 can be set longer, which should make the device easier to operate.

5.2: Leaf Spring 205

In the above embodiments, the leaf springs 205 and 255 are described as examples of restricting members, but the restricting member is not limited to the leaf springs 205 and 255. For example, the restricting member can be a leaf spring made of plastic, or an elastic member other than a leaf spring can be used as the restricting member.

Figures 8A, 8B:
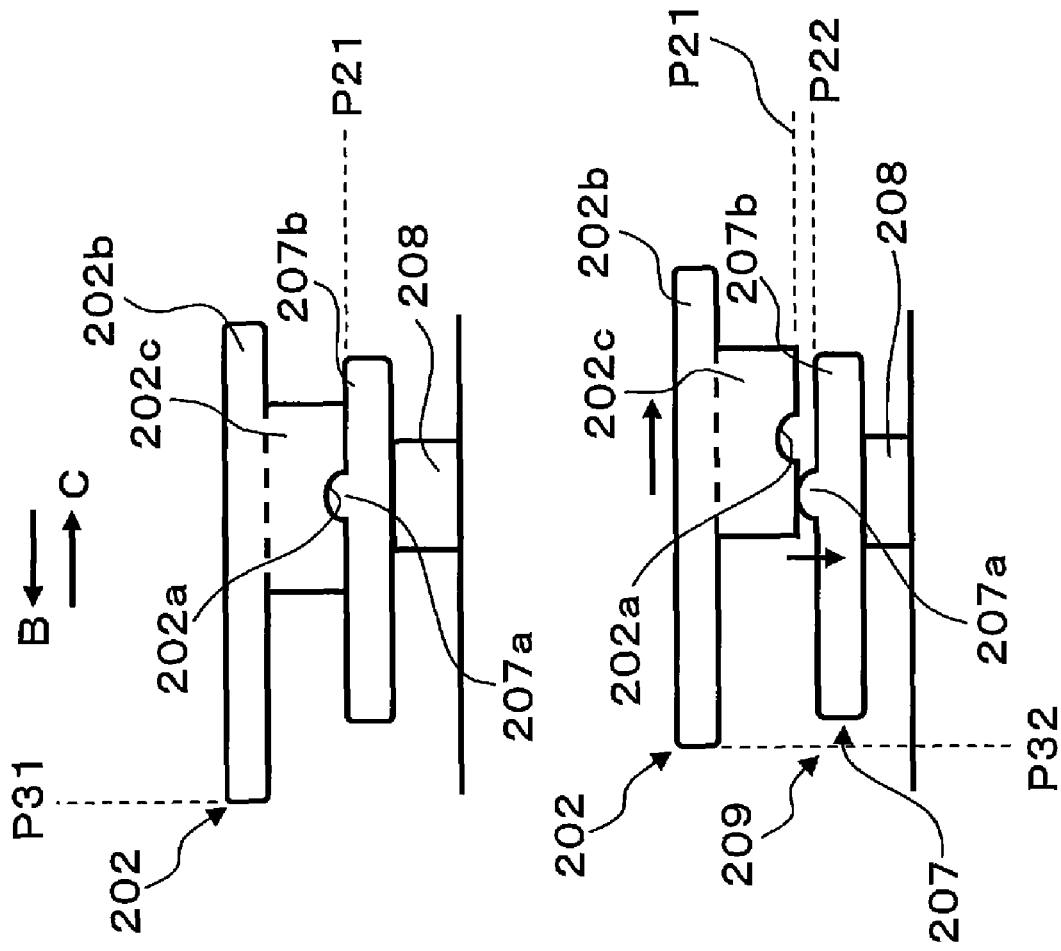
FIGS. 8A and 8B are simplified diagrams of a second lock lever and a restricting member (another embodiment)

FIGS. 8A and 8B are simplified side views of a restricting member 209 and the second lock lever 202. The first lock lever 201 is omitted from FIGS. 8A and 8B. FIG. 8A shows a state in which the second lock lever 202 is disposed at the locked position P31, and FIG. 9B shows a state in which the second lock lever 202 is disposed at the unlocked position P32.

The restricting member 209 has a restricting plate 207 and a biasing member 208. The restricting plate 207 has a restricting plate main body 207b and a convex part 207a. The restricting plate main body 207b has a substantially plate-like shape. The convex part 207a protrudes from the restricting plate main body 207b toward the second lock lever 202. The biasing member 208 pushes the restricting plate 207 toward the second lock lever 202. The biasing member 208 is mounted to the lid 200, and can be made up of a coil spring, a piece of rubber, or the like.

In the state shown in FIG. 8A, the convex part 207a of the restricting plate 207 is fitted into the concave part 202a of the second lock lever 202. When the second lock lever 202 is moved in the C direction, the concave part 202a and the convex part 207a come apart, and the restricting plate 207 is pushed down against the biasing force of the biasing member 208. Thus, the restricting member 209 is guided by the second lock lever 202 from the restricting position P21 to the retracted position P22.

When the restricting plate 207 is pushed down against the biasing force of the biasing member 208, the fitting of the concave part 202a of the second lock lever 202 together with the convex part 207a of the restricting plate 207 does not necessarily have to be utilized. The constitution shown in FIGS. 9A and 9B is also possible.

FIGS. 9A and 9B are simplified side views of a restricting member 219 and a second lock lever 212. The first lock lever 201 is omitted from FIGS. 9A and 9B. FIG. 9A shows a state in which the second lock lever 212 is disposed at the locked position P31, and FIG. 8B shows a state in which the second lock lever 212 is disposed at the unlocked position P32.

As shown in FIGS. 9A and 9B, the second lock lever 212 has a lever main body 202b and a guide portion 212c. The guide portion 212c has an inclined face 212g. The restricting member 219 has a restricting plate 217 and a biasing member 208. The restricting plate 217 has a restricting plate main body 207b and a slider 217a. The slider 217a protrudes from the restricting plate main body 207b toward the second lock lever 212, and has an inclined face 217g. The inclined face 217g comes into contact with the inclined face 212g.

When the second lock lever 212 moves in the C direction, the restricting plate 217 is pushed down by the inclined face 212g of the guide portion 212c. Thus, the restricting member 219 is guided by the second lock lever 212 from the restricting position P21 to the retracted position P22.

5.3: Electronic Device

In the above embodiments, an electronic device was described using the digital camera 100 as an example, but the electronic device is not limited to the digital camera 100. For example, it may be any other device as long as a lid and a lid locking mechanism are installed in the device.

General Interpretation of Terms

In understanding the scope of the present disclosure, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Also as used herein to describe the above embodiment(s), the following directional terms "forward", "rearward", "above", "downward", "vertical", "horizontal", "below" and "transverse" as well as any other similar directional terms refer to those directions of an electronic device. Accordingly, these terms, as utilized to describe the present invention should be interpreted relative to an electronic device.

The term "configured" as used herein to describe a component, section, or part of a device implies the existence of other unclaimed or unmentioned components, sections, members or parts of the device to carry out a desired function.

The terms of degree such as "substantially", "about" and "approximately" as used herein mean a reasonable amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. An electronic device comprising:
a housing defining an interior space with an opening to access the interior space;
a lid coupled to the housing to close and unclose the opening;
a first locking member coupled to the lid and movable in a first direction between a closed position to lock the lid over the opening and an open position to unlock the lid from over the opening;
a restricting member mounted to the lid and movable between a restricting position to prevent the first locking member from moving to the open position and a retracted position to permit the first locking member to move to the open position; and
a second locking member coupled to the lid and movable in the first direction to allow the restricting member to switch between the restricting position and the retracted position.

2. The electronic device according to claim 1, wherein the restricting member includes a first end fixed to the lid and a second end movably arranged to contact the first locking member by bending the restricting member to shift between the restricting position and the retracted position.

3. The electronic device according to claim 1, wherein a part of the restricting member is disposed within the range of movement of the first locking member at the restricting position.

4. The electronic device according to claim 1, wherein a part of the first locking member is disposed within the range of movement of the restricting member at the open position.

5. The electronic device according to claim 1, wherein the restricting member includes a restrictor configured to prohibits movement of the second locking member in the first direction.

6. The electronic device according to claim 5, wherein the second locking member is prohibited from moving in the first direction when the restricting member is disposed at the restricting position.

7. The electronic device according to claim 6, wherein the second locking member includes a guide portion configured to interact with the restrictor to guide the restricting member between the restricting position and the retracted position.

8. The electronic device according to claim 7, wherein the guide portion has a concave part, and the restrictor has a convex part configured to engage with the concave part.

9. The electronic device according to claim 8, wherein the convex part engages the concave part when the restricting member is at the restricting position.

10. The electronic device according to claim 1, wherein
the second locking member is movably disposed between a first position and a second position, the first position is when the restricting member is at the restricting position and the second position is when the restricting member is at the retracted position, and the direction in which the first locking member moves from the open position to the closed position is the same direction in which the second locking member moves from the second position to the first position.

11. The electronic device according to claim 1, wherein
the range of movement of the first locking member overlaps the range of movement of the second locking member when viewed in a second direction that is perpendicular to the first direction.

12. The electronic device according to claim 1, wherein
the second locking member is arranged to avoid interference with the first locking member.

13. The electronic device according to claim 2, wherein
the restricting member is a leaf spring that has a slender shape and extends along the first direction.

14. The electronic device according to claim 1, wherein
the first locking member is aligned with the second locking member along the first direction.

* * * * *

UNITED STATES PATENT AND TRADEMARK OFFICE
CERTIFICATE OF CORRECTION

PATENT NO. : 8,395,060 B2
APPLICATION NO. : 13/027155
DATED : March 12, 2013
INVENTOR(S) : Kenichi Kajiyama, Yuji Tominaga and Tomoki Sakamoto It is certified that error appears in the above-identified patent and that said Letters Patent is hereby corrected as shown below:

In the Specifications:

In column 2, lines 26 and 27, please change the description of Figs. 4A, 4B, and 4C from:

"FIG. 4 is a cross section of the main parts of a lid locking mechanism;"

to

--FIGS. 4A, 4B, and 4C are cross sections of the main parts of a lid locking mechanism;--

In the Claims:

In column 12, lines 48-51, please change claim 5 from:

"5. The electronic device according to claim 1, wherein the restricting member includes a restrictor configured to prohibits movement of the second locking member in the first direction"

to

--5. The electronic device according to claim 1, wherein the restricting member includes a restrictor configured to prohibit movement of the second locking member in the first direction--

Signed and Sealed this
Fourth Day of June, 2013

Teresa Stanek Rea
*Acting Director of the United States Patent and Trademark Office*